United States Patent [19]

Scharf et al.

[11] Patent Number: 5,422,510

[45] Date of Patent: Jun. 6, 1995

[54] MOS TRANSISTOR WITH NON-UNIFORM CHANNEL DOPANT PROFILE

[75] Inventors: Brad W. Scharf, Winchester, Mass.; Faran Nouri, Palo Alto, Calif.; Shaheen Mohamedi, Chandler, Ariz.

[73] Assignee: Analog Devices, Incorporated, Norwood, Mass.

[21] Appl. No.: 969,037

[22] Filed: Oct. 30, 1992

[51] Int. Cl.$^6$ .................. H01L 29/06; H01L 29/78
[52] U.S. Cl. .................. 257/401; 257/402; 257/404; 257/655; 257/657
[58] Field of Search .......... 257/401, 404, 402, 655, 257/657; 437/44, 45

[56] References Cited

U.S. PATENT DOCUMENTS

| 4,395,725 | 7/1983 | Parekh | 257/404 |
| 4,549,336 | 10/1985 | Sheppard | 257/404 |
| 5,012,315 | 4/1991 | Shur | 257/365 |
| 5,231,299 | 7/1993 | Ning et al. | 257/404 |

FOREIGN PATENT DOCUMENTS 4154171  5/1992  Japan ................. 257/404

*Primary Examiner*—Mark V. Prenty
*Attorney, Agent, or Firm*—Parmelee, Bollinger & Bramblett

[57] ABSTRACT

An MOS transistor wherein the channel between the source and drain is formed with two regions having different dopant concentrations. The region adjacent the source has a normal concentration, while that adjacent the drain has a reduced dopant concentration. This reduces the degrading effects of hot carrier injection, thereby extending the life of the transistor.

2 Claims, 1 Drawing Sheet

MOS TRANSISTOR WITH NON-UNIFORM
CHANNEL DOPANT PROFILE

BACKGROUND OF THE INVENTION

1. Field of the Invention

This invention relates to MOS transistors. More particularly, this invention relates to such transistors arranged to avoid the degrading effects of "hot carrier" injection into the gate oxide.

2. Description of the Prior Art

The degrading effects of "hot carrier" injection into the gate oxide of a MOSFET have been known for some time. Such "hot carriers" typically are electrons, and have energies higher than thermal energy. The adverse effects comprise parametric instabilities such as changes in threshold voltage ($V_T$), as well as changes in sub-threshold slope and transconductance. With the ever-smaller dimensions resulting from progressive advances in miniaturization, and particularly when operating the device at desired higher voltages, these adverse effects can result in substantial reduction of the predicted useful or stable lifetime of a MOSFET device, e.g., from 10 years to a few days.

The observed effects seemingly are due at least in part to hot electrons becoming trapped in the Si-$O_2$ under the FET gate, thereby raising the threshold voltage required to obtain a specified current, or reducing the current for a given gate bias voltage. Reduced dimensions exacerbate these effects because the electric fields which create the energetic carriers are correspondingly increased.

An increase in substrate current (Isub) correlates with increased degradation due to hot carrier injection, and thus has been used as an indicator of the extent of the problem. Such substrate current in NMOS devices are holes, and add to the drain current so as to produce a non-linear output characteristic. The effect of hot carrier injection on device lifetime is determined by accelerated testing, as by placing the test device under increased drain voltage conditions. Lifetime can be defined as the time to reach a 10 mV shift in device threshold voltage ($V_T$), and is extrapolated from a plot of lifetime ($\tau$) vs. Isub under DC stress.

Various proposals have been made for solving this problem. For example, it has been proposed to reduce the dopant (impurity) concentration in the drain region. However, none of the prior proposals have been fully effective in adequately minimizing the degradation of performance due to hot carrier injection, particularly for applications in the field of analog circuits.

SUMMARY OF THE INVENTION

It is believed that the effects of hot carrier injection are primarily influenced by conditions at or near the drain-to-channel junction. It has been found that significant improvement in device lifetime can be achieved by altering the dopant profile in the channel region near the drain. More particularly, in one aspect of the invention, improved results can be obtained by forming the channel with two regions, one adjacent the source having a normal dopant concentration, and the second adjacent the drain having a reduced dopant concentration. This reduces the maximum electric field intensity (Em) near the channel-to-drain junction, and results in substantial improvement in stability and predicted lifetime for the device. For example, increases in lifetime of nearly two orders of magnitude appear to be achievable.

Other objects, aspects and advantages of the invention will in part be pointed out in, and in part apparent from, the following detailed description of a preferred embodiment of the invention considered together with the accompanying drawings.

DETAILED DESCRIPTION OF A PREFERRED EMBODIMENT

Figure 1:
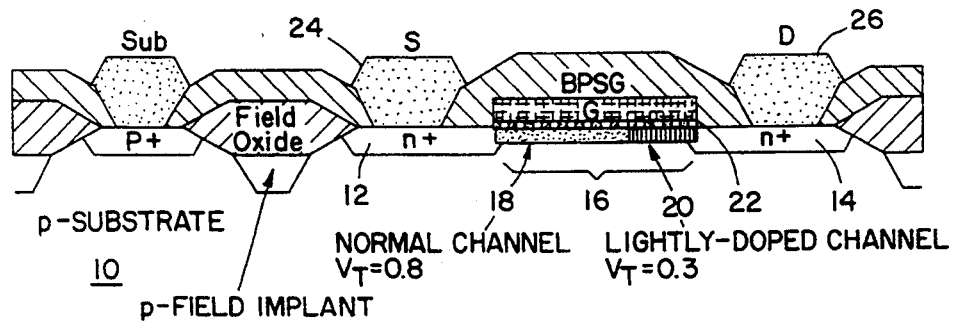
FIG. 1 is a cross-section showing the arrangement of an NMOS transistor formed in accordance with this invention.

Referring first to FIG. 1, a transistor is formed in the usual silicon substrate generally indicated at 10, and having (in this case) p-type doping such as boron. Source and drain regions 12 and 14 are formed with n+ dopant, such as arsenic/phosphorous, and are separated by a channel region generally indicated at 16. The transistor as shown would typically be part of an integrated circuit, e.g., formed in a CMOS or BICMOS process.

The channel region 16 is subdivided into two sections 18, 20 which are serially disposed along a line joining the source and drain regions. The left-hand section 18 has a normal dopant concentration, and the right-hand section (adjacent the drain) is lightly-doped. Immediately above the channel is the usual layer 22 of oxide between the channel and the gate G, the latter preferably being polysilicon. The gate is covered by deposited borophosphosilicate glass (labelled BPSG). When a positive voltage is applied to the gate, the channel region is inverted from p-type to n-type.

Contacts 24, 26 are provided for the source and drain regions 12, 14, and another contact (labelled Sub) is provided for the substrate, i.e., the back-gate of the transistor. The usual field oxide is included as shown, together with a p-field implant for isolation purposes.

The channel sections 18, 20 preferably are developed by the use of ion implantation, and the dopant concentration may be controlled by the so-called threshold voltage ($V_T$) adjust implant. In one NMOS test device the first section 18 was doped by a $V_T$ adjust implant having an ion flux density of approximately $1.1 \times 10^{12}$ atoms/cm$^2$ at 30 Kev. The second section 20 was doped by a smaller $V_T$ adjust implant having an ion flux density of approximately $2 \times 10^{11}$ atoms/cm$^2$ at 30 Kev. The lengths of the channel sections (as measured along a line joining source and drain) are in a ratio of about 2:1, and in the disclosed embodiment the lightly-doped section 20 had a length of about 1.5 $\mu$m (microns).

Figure 2:
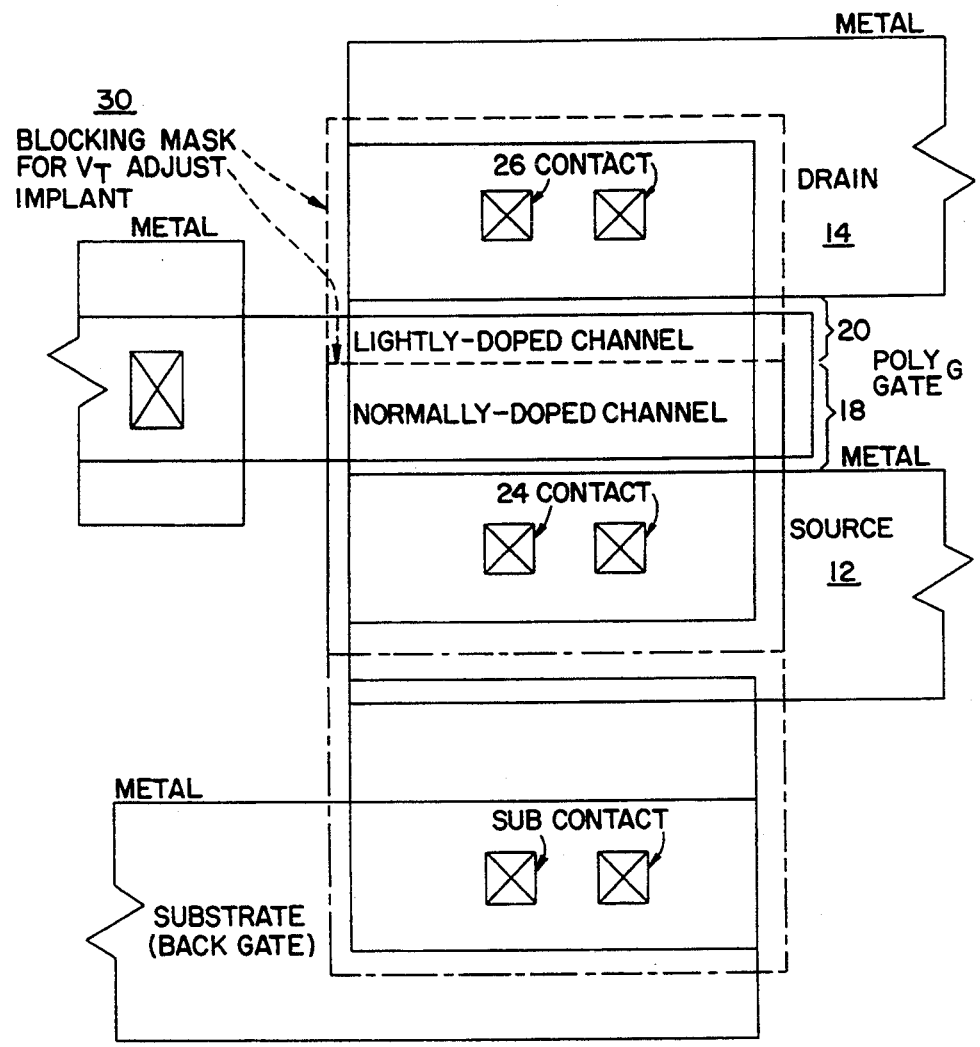
FIG. 2 is a plan view illustrating the dimensional relationships of the transistor regions and associated transistor and process elements.

The differential implant dosage for channel sections 18 and 20 can be developed in various ways. For example, it can be produced by placing a blocking mask over the channel section to be lightly doped, as schematically outlined at 30 in FIG. 2. With this mask in place, the channel section 18 will receive a full dose from the ion implanter while the other section 20 will receive a reduced dose suitable to meet the lesser concentration of dopant specified for that section.

Although a preferred embodiment of the invention has been disclosed herein in detail, this has been for the purpose of illustrating the invention, and should not be construed as necessarily limiting the scope of the invention since it is apparent that many changes can be made by those skilled in the art while still practicing the invention claimed herein.

What is claimed is:

1. An MOS semiconductive device comprising a substrate having source and drain regions and a doped channel region therebetween;

said channel region being subdivided into first and second sections serially disposed along a line joining said source and drain regions;

said first section being adjacent said source region and said second section being adjacent said drain region;

said second section being rectangular and more lightly doped than said first section;

the lengths of said first and second sections as measured along said line being in a ratio of approximately 2:1.

2. An MOS device as in claim 1, wherein the length of said second section is approximately 1.5 microns.

* * * * *